US012652993B2

(12) United States Patent
Katono

(10) Patent No.: US 12,652,993 B2
(45) Date of Patent: Jun. 9, 2026

(54) BOARD PROCESSING EQUIPMENT AND RECOVERY PROCESSING METHOD

(71) Applicant: Tokyo Electron Limited, Tokyo (JP)

(72) Inventor: Hiroki Katono, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 867 days.

(21) Appl. No.: 17/826,167

(22) Filed: May 27, 2022

(65) Prior Publication Data

US 2022/0384223 A1    Dec. 1, 2022

(30) Foreign Application Priority Data

May 27, 2021    (JP) ................................. 2021-088850
May 17, 2022    (JP) ................................. 2022-080599

(51) Int. Cl.
*H10P 72/00*        (2026.01)
*C23C 16/52*        (2006.01)

(52) U.S. Cl.
CPC .......... *H10P 72/0612* (2026.01); *C23C 16/52* (2013.01); *H10P 72/0616* (2026.01)

(58) Field of Classification Search
CPC ......... H01L 21/67276; H01L 21/67288; H01L 21/67103; H01L 21/67109; H01L 21/67248; H01L 21/6831; C23C 16/52
See application file for complete search history.

(56) References Cited

U.S. PATENT DOCUMENTS

| | | | | |
|---|---|---|---|---|
| 11,462,444 B2* | 10/2022 | Nagaike | ............ | H01L 21/67769 |
| 2007/0192064 A1* | 8/2007 | Nakamura | ............ | G06Q 10/06 |
| | | | | 702/182 |
| 2010/0053587 A1* | 3/2010 | Usui | ..................... | G03F 9/7011 |
| | | | | 355/75 |
| 2013/0178954 A1* | 7/2013 | Mizuguchi | ......... | G05B 23/0289 |
| | | | | 700/78 |
| 2016/0211165 A1* | 7/2016 | McChesney | ...... | H01L 21/67069 |
| 2019/0371634 A1* | 12/2019 | Yamada | ............ | H01L 21/67288 |

FOREIGN PATENT DOCUMENTS

| | | | | | |
|---|---|---|---|---|---|
| CN | 1682165 A | * | 10/2005 | ............ | H01L 21/02 |
| CN | 109637947 A | * | 4/2019 | ....... | H01L 21/67276 |
| JP | H05135064 A | * | 6/1993 | .......... | G06F 18/254 |
| JP | 2005064366 A | * | 3/2005 | ....... | H01L 21/67736 |
| JP | 2006203145 A | * | 8/2006 | ......... | B60B 17/0017 |
| JP | 2007329345 A | * | 12/2007 | ....... | H01L 21/67736 |
| JP | 2009135253 A | | 6/2009 | | |

(Continued)

*Primary Examiner* — Mohammed Shamsuzzaman
(74) *Attorney, Agent, or Firm* — XSENSUS LLP

(57) ABSTRACT

A substrate processing apparatus includes a chamber, a plurality of devices, and a controller. The chamber is subjected to substrate processing. The plurality of devices execute operations related to substrate processing. The controller controls the operations of the plurality of devices. Further, the controller determines whether or not an error has occurred during performing the substrate processing in a chamber, and causes the plurality of devices to automatically execute a recovery operation corresponding to the content of the error that has occurred when the controller determines that the error has occurred and has suspended the substrate processing.

13 Claims, 2 Drawing Sheets

(56) References Cited

FOREIGN PATENT DOCUMENTS

| | | | | | | |
|----|----------------|----|---|---------|--------|-----------------|
| JP | 2010503231 | A | * | 1/2010 | ....... | H01L 21/67248 |
| JP | 2010171288 | A | | 8/2010 | | |
| JP | 4616798 | B2 | * | 1/2011 | ....... | H01L 21/67736 |
| JP | 2014068046 | A | * | 4/2014 | .......... | G06F 18/254 |
| JP | 5491022 | B2 | * | 5/2014 | ....... | H01L 21/67276 |
| JP | 5942213 | B2 | * | 6/2016 | ........ | H01J 37/32082 |
| JP | 2017183585 | A | * | 10/2017 | ....... | H01L 21/67276 |
| JP | 2019083309 | A | | 5/2019 | | |
| JP | 2020009920 | A | * | 1/2020 | ....... | H01L 21/67736 |
| JP | WO2020059011 | A1 | * | 8/2021 | ............. | H01L 21/02 |
| KR | 20070053130 | A | * | 5/2007 | ............. | G01D 21/00 |
| KR | 20070065234 | A | * | 6/2007 | .......... | G05B 23/027 |
| KR | 20120010997 | A | * | 2/2012 | .......... | G06F 18/254 |
| KR | 101280859 | B1 | * | 7/2013 | ........ | G05B 19/4063 |
| KR | 20150101203 | A | * | 9/2015 | ....... | H01L 21/67276 |
| KR | 20150101206 | A | * | 9/2015 | ....... | H01L 21/67276 |
| WO | 2005057993 | A1 | | 6/2005 | | |

* cited by examiner

| ERROR CONTENT | RECOVERY OPERATION | STANDBY TIME | NUMBER OF RETRIES | DISABLE |
|---|---|---|---|---|
| RF SIGNAL SWITCHING FAILURE | RETRY | 30 SECONDS | 1 TIME | OFF |
| PRESSURE FAILURE | PROCESSING STOP | 30 SECONDS | – | OFF |
| ATTRACTION FAILURE | MAINTENANCE SHIFT | 30 SECONDS | – | OFF |
| ⋮ | ⋮ | ⋮ | ⋮ | ⋮ |

START

S101
HAS ERROR OCCURRED?

No

Yes

S102
IS SUBSTRATE PROCESSING SUSPENDED?

No

Yes  S103

INSTRUCT EXECUTION OF RECOVERY OPERATION

END

BOARD PROCESSING EQUIPMENT AND RECOVERY PROCESSING METHOD

CROSS-REFERENCE TO RELATED APPLICATIONS

This application claims priorities to Japanese Patent Applications No. 2021-88850, filed on May 27, 2021 and No. 2022-80599, filed on May 17, 2022, the entire contents of which are incorporated herein by references.

TECHNICAL FIELD

The present disclosure relates to a substrate processing apparatus and a recovery processing method.

BACKGROUND

Patent Document 1 discloses a substrate processing apparatus that automatically retrieves substrates remaining in a chamber after an operator performs recovery work and fixes an error when the error occurs during performing substrate processing in the chamber.

PRIOR ART DOCUMENTS

Patent Documents

[Patent Document 1]
 Japanese Patent Application Publication No. 2006-203145

SUMMARY

Technical Problem

The present disclosure relates to a substrate processing apparatus and a recovery processing method capable of suppressing the deterioration of productivity when an error occurs during performing substrate processing in a chamber.

Solution to Problem

A substrate processing apparatus according to an aspect of the present disclosure includes a chamber, a plurality of devices, and a controller. The chamber is subjected to substrate processing. The plurality of devices execute operations related to substrate processing. The controller controls the operations of the plurality of devices. Further, the controller determines whether or not an error has occurred during performing the substrate processing in a chamber, and causes the plurality of devices to automatically execute a recovery operation corresponding to the content of the error that has occurred when the controller determines that the error has occurred and has suspended the substrate processing.

Advantageous Effect of the Invention

According to the present disclosure, it is possible to suppress the deterioration of productivity when an error occurs during performing the substrate processing in a chamber.

DETAILED DESCRIPTION

Hereinafter, embodiments of a substrate processing apparatus and a recovery processing method disclosed in the present application will be described in detail with reference to drawings. The present embodiment is not limited to the substrate processing apparatus and the recovery processing method.

In the related technique described above, since it takes a certain amount of time for an operator performing recovery work to rush to the site, the substrate processed in the chamber is left in the chamber until the recovery work is performed. Particles or the like generated by substrate processing adhere to the substrate left in the chamber, which may deteriorate the quality of the substrate, resulting in deterioration of the productivity of the substrate processing apparatus.

Further, in the related technique described above, since the recovery work is delayed due to the absence of the operator, and the recovery of the chamber is delayed by the amount corresponding to the delay of the recovery work, the operating rate of the substrate processing apparatus may deteriorate.

Therefore, a technique capable of suppressing the deterioration of productivity when an error occurs during performing substrate processing in a chamber is expected.

Embodiment

Figure 1:
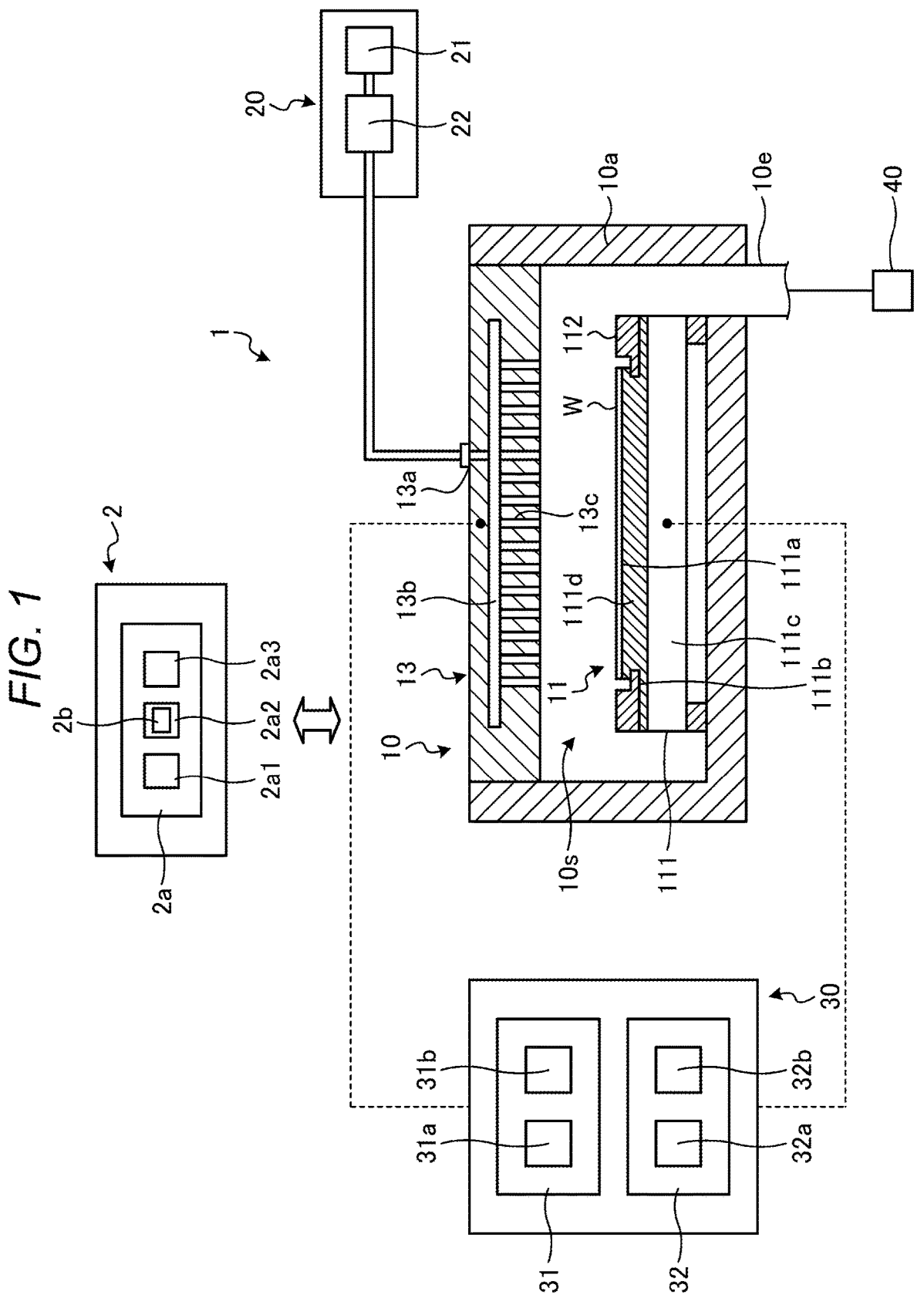
FIG. 1 is a diagram illustrating an example of a plasma processing system according to an embodiment of the present disclosure.

[Configuration of Plasma Processing System]
 Hereinafter, an example of the configuration example of a plasma processing system will be described. FIG. 1 is a diagram illustrating an example of a plasma processing system according to an embodiment of the present disclosure.

The plasma processing system includes a capacitively coupled plasma processing apparatus (hereinafter, also referred to as a plasma processing apparatus, a plasma processing apparatus is an example of a substrate processing apparatus of the present disclosure) 1 and a controller 2. The plasma processing apparatus 1 includes a plasma processing chamber (hereinafter, also referred to as a chamber) 10, a gas supply 20, a power source 30, and an exhaust system 40. Further, the plasma processing apparatus 1 includes a substrate support 11 and a gas introduction unit. The gas introduction unit is configured to introduce at least one processing gas into the plasma processing chamber 10. The gas introduction unit includes a shower head 13. The substrate support 11 is disposed in the plasma processing chamber 10. The shower head 13 is disposed above the substrate support 11. In one embodiment, the shower head 13 constitutes at least a part of a ceiling of the plasma processing chamber 10. The plasma processing chamber 10 has a plasma processing space 10s defined by the shower head 13, a sidewall 10a of the plasma processing chamber 10, and the substrate support 11. The plasma processing chamber 10 has at least one gas supply port for supplying at least one processing gas into the plasma processing space 10s, and at least one gas exhaust port for exhausting the gas from the plasma processing space. The sidewall 10a is grounded. The shower head 13 and the substrate support 11 are electrically insulated from a housing of the plasma processing chamber 10.

The substrate support 11 includes a main body 111 and a ring assembly 112. The main body 111 has a central region (substrate support surface) 111*a* for supporting the substrate (wafer) W, and an annular region (ring support surface) 111*b* for supporting the ring assembly 112. The annular region 111*b* of the main body 111 surrounds the central region 111*a* of the main body 111 in a plan view. The substrate W is disposed on the central region 111*a* of the main body 111 and the ring assembly 112 is disposed on the annular region 111*b* of the main body 111 to surround the substrate W on the central region 111*a* of the main body 111. In one embodiment, the main body 111 includes a base 111*c* and an electrostatic chuck 111*d*. The base 111*c* includes a conductive member. The conductive member of the base 111*c* functions as a lower electrode.

The electrostatic chuck 111*d* is disposed on the base 111*c* and has a function of absorbing the substrate W and/or an edge ring to be described later by an electrostatic force. The upper surface of the electrostatic chuck 111*d* includes the substrate support surface 111*a*. The ring assembly 112 includes one or more annular members. At least one of the one or more annular members is an edge ring. Although not illustrated, the substrate support 11 may include a temperature control module configured to adjust at least one of the electrostatic chuck 111*d*, the ring assembly 112, and the substrate W to a target temperature. The temperature control module may include a heater, a heat transfer medium, a flow path, or a combination thereof. A heat transfer fluid, such as brine or gas, flows through the flow path. Further, the substrate support 11 may include a heat transfer gas supply configured to supply a heat transfer gas between the rear surface of the substrate W and the substrate support surface 111*a*.

The shower head 13 is configured to introduce at least one processing gas from the gas supply 20 into the plasma processing space 10*s*. The shower head 13 has at least one gas supply port 13*a*, at least one gas diffusion chamber 13*b*, and a plurality of gas introduction ports 13*c*. The processing gas supplied to the gas supply port 13*a* passes through the gas diffusion chamber 13*b* and is introduced into the plasma processing space 10*s* from the plurality of gas introduction ports 13*c*. Further, the shower head 13 includes a conductive member. The conductive member of the shower head 13 functions as an upper electrode. The gas introduction unit may include, in addition to the shower head 13, one or a plurality of side gas injectors (SGI) that are attached to one or a plurality of openings formed in the sidewall 10*a*.

The gas supply 20 may include at least one gas source 21 and at least one flow rate controller 22. In one embodiment, the gas supply 20 is configured to supply at least one processing gas from the respective corresponding gas sources 21 to the shower head 13 via the respective corresponding flow rate controllers 22. Each flow rate controller 22 may include, for example, a mass flow controller or a pressure-controlled flow rate controller. Further, the gas supply 20 may include one or more flow rate modulation devices that modulate or pulse flow rates of at least one processing gas.

The power source 30 includes an RF power source 31 coupled to plasma processing chamber 10 via at least one impedance matching circuit. The RF power source 31 is configured to supply at least one RF signal (RF power), such as a source RF signal and a bias RF signal, to the conductive member of the substrate support 11 and/or the conductive member of the shower head 13. As a result, plasma is formed from at least one processing gas supplied into the plasma processing space 10*s*. Accordingly, the RF power source 31 may function as at least a portion of a plasma generator configured to generate plasma from one or more processing gases in the plasma processing chamber 10. Further, supplying of the bias RF signal to the conductive member of the substrate support 11 can generate a bias potential in the substrate W to draw an ion component in the formed plasma to the substrate W.

In one embodiment, the RF power source 31 includes a first RF generator 31*a* and a second RF generator 31*b*. The first RF generator 31*a* is coupled to the conductive member of the substrate support 11 and/or the conductive member of the shower head 13 via at least one impedance matching circuit, and configured to generate a source RF signal (source RF power) for plasma generation. In one embodiment, the source RF signal has a frequency in the range of 13 MHz to 150 MHz. In one embodiment, the first RF generator 31*a* may be configured to generate a plurality of source RF signals having different frequencies. The generated one or a plurality of source RF signals are supplied to the conductive member of the substrate support 11 and/or the conductive member of the shower head 13. The second RF generator 31*b* is coupled to the conductive member of the substrate support 11 via at least one impedance matching circuit, and configured to generate a bias RF signal (bias RF power). In one embodiment, the bias RF signal has a lower frequency than the source RF signal. In one embodiment, the bias RF signal has a frequency in the range of 400 kHz to 13.56 MHz. In one embodiment, the second RF generator 31*b* may be configured to generate a plurality of bias RF signals having different frequencies. The generated one or more bias RF signals are supplied to the conductive member of the substrate support 11. Further, in various embodiments, at least one of the source RF signal and the bias RF signal may be pulsed.

Further, the power source 30 may include a DC power source 32 coupled to the plasma processing chamber 10. The DC power source 32 includes a first DC generator 32*a* and a second DC generator 32*b*. In one embodiment, the first DC generator 32*a* is connected to the conductive member of the substrate support 11 and configured to generate a first DC signal. The generated first bias DC signal is applied to the conductive member of the substrate support 11. In one embodiment, the first DC signal may be applied to another electrode, such as an electrode in the electrostatic chuck 111*d*. In one embodiment, the second DC generator 32*b* is configured to be connected to the conductive member of the shower head 13 and to generate a second DC signal. The generated second DC signal is applied to the conductive member of the shower head 13. In various embodiments, at least one of the first and second DC signals may be pulsed. The first and second DC generators 32*a* and 32*b* may be provided in addition to the RF power source 31, and the first DC generator 32*a* may be provided instead of the second RF generator 31*b*.

The exhaust system 40 may be connected to, for example, a gas exhaust port 10*e* disposed at a bottom portion of the plasma processing chamber 10. The exhaust system 40 may include a pressure adjusting valve and a vacuum pump. The pressure in the plasma processing space 10*s* is adjusted by the pressure adjusting valve. The vacuum pump may include a turbo molecular pump, a dry pump, or a combination thereof.

The controller 2 processes computer-executable instructions for instructing the plasma processing apparatus 1 to execute various steps described herein below. The controller 2 may be configured to control the respective components of the plasma processing apparatus 1 to execute the various steps described herein below. In an embodiment, part or all of the controller 2 may be included in the plasma processing apparatus 1. The controller 2 may include, for example, a computer 2a. For example, the computer 2a may include a processor (central processing unit (CPU)) 2a1, a storage 2a2, and a communication interface 2a3. The processor 2a1 may be configured to perform various control operations based on a program stored in the storage 2a2. The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

In a related plasma processing apparatus, when an error has occurred during performing the substrate processing in the chamber 10, an operator rushes to the site to perform recovery work, and the substrate W remaining in the chamber 10 is automatically retrieved after the error is fixed by the recovery work.

However, in this method, since it takes a certain amount of time for the operator performing the recovery work to rush to the site, the substrate W that has been substrate-processed in the chamber 10 is left in the chamber 10 until the recovery work is performed. Particles or the like generated by the substrate processing adhere to the substrate W left in the chamber 10, which may deteriorate the quality of the substrate W, resulting in deterioration of the productivity of the plasma processing apparatus.

Therefore, in the plasma processing apparatus 1 according to the embodiment, the presence or absence of an error is determined during performing the substrate processing in the chamber 10, and when determination is made that an error has occurred, the recovery operation corresponding to the content of the error is executed on the plurality of devices performing the operation related to the substrate processing. As a result, since the recovery operation can be executed regardless of the presence or absence of the operator, it is possible to shorten the time for which the substrate W is left in the chamber 10, and as a result, it is possible to suppress the deterioration of the quality and the deterioration of the productivity of the substrate W. Further, since the recovery time of the chamber 10 can be shortened by executing the recovery operation, it is possible to suppress the deterioration of the operating rate of the plasma processing apparatus 1.

Here, the plurality of devices that execute an operation related to substrate processing include, for example, the gas supply 20, the power source 30, the exhaust system 40, and the electrostatic chuck 111d of the plasma processing apparatus 1. In the following description, the plurality of devices that execute an operation related to substrate processing will be referred to as "a plurality of devices" as appropriate.

Further, the recovery operation is executed in accordance with a recovery operation table 2b stored in the storage 2a2.
[Example of Recovery Operation Table]
An example of the recovery operation table 2b will now be described with reference to FIG. 2.

The recovery operation table 2b is a table in which the content of a target error to be determined is mainly associated with the content of a recovery operation to be executed. Specifically, as shown in FIG. 2, the recovery operation table

2b may include the following items: "error content"; "recovery operation"; "standby time"; "number of retries", and "disable".

The "error content" refers to information indicating the content of an error such as "RF signal switching failure", "pressure failure", and "attraction failure", for example.

The "recovery operation" refers to information indicating the content of a recovery operation to be executed by the plurality of devices executing an operation related to substrate processing. The content of the recovery operation may be set, for example, from a "retry", a "processing stop", and a "maintenance shift". The "retry" refers to an operation for re-executing an operation related to substrate processing. The "processing stop" refers to an operation of stopping the suspended substrate processing and retrieving a substrate. The "maintenance shift" refers to an operation of shifting to a maintenance mode in which the execution of an operation related to substrate processing is prohibited. For example, in the "recovery operation", "retry" may be set to be associated with "RF signal switching failure" in the "error content", "processing stop" may be set to be associated with "pressure failure", and "maintenance shift" may be set to be associated with "attraction failure".

The "standby time" refers to information indicating the standby time from the occurrence of an error to the start of a corresponding recovery operation, for each content of error. For example, "30 seconds" of "RF signal switching failure" indicates that the corresponding "retry" is executed after 30 seconds elapses since determination is made that an error has occurred.

The "number of retries" refers to information indicating the number of retries for which a retry is to be executed.

The "disable" refers to information for enabling or disabling the execution of a corresponding recovery operation for each content of error. The "OFF" when the execution of a recovery operation is enabled, or "ON" when the execution of a recovery operation is disabled may be set for the "disable".

An identifier (error ID) indicating the content of the error may be displayed in the "error content". Further, an identifier (recovery operation ID) indicating the content of the recovery operation may also be displayed in the "recovery operation".

Each item stored in the recovery operation table 2b can be rewritten by an instruction input by the operator. The instruction input by the operator is received from, for example, an input/output interface (not illustrated) of the computer 2a.
[Error Handling Processing]
Next, the content of the error handling processing executed by the controller 2 will be described with reference to FIG. 3. FIG. 3 is a flowchart illustrating an example of the processing procedure of the error handling processing executed by the controller 2. The error handling processing is processing for suppressing the deterioration of productivity when an error occurs during performing the substrate processing in the chamber 10.

Figures 2, 3:
FIG. 2 is a diagram illustrating an example of a recovery operation table.
FIG. 3 is a flowchart illustrating an example of a processing procedure of error handling processing performed by a controller.

As shown in FIG. 3, the controller 2 determines whether or not an error has occurred during performing the substrate processing in the chamber 10 (step S101). Specifically, the controller 2 uses a meter that measures various parameters indicating the state of substrate processing being performed in the chamber 10 to determine whether or not an error has occurred in the plasma processing apparatus 1.

The meter includes, for example, an RF amplitude meter that measures the amplitude of an RF signal supplied from the RF power source 31, a pressure meter that measures the pressure in the chamber 10, or a voltage meter that measures an attraction voltage that is applied to the electrode in the electrostatic chuck 111d. During performing the substrate processing in the chamber 10, the meter performs parameter measurements such as RF amplitude measurement, pressure measurement, or voltage measurement for absorbing a substrate and/or an edge ring, and sends the measurement results to the controller 2.

When the measurement results are acquired from the meter, the controller 2 determines whether or not an error has occurred in the plasma processing apparatus 1 based on the acquired measurement results. In the present embodiment, the controller 2 determines whether or not the RF signal switching is good based on the measurement result of the RF amplitude measurement, determines whether or not the pressure in the chamber is good based on the measurement result of the pressure measurement, and determines whether or not the attraction of the substrate and/or the edge ring is good based on the measurement result of the attraction voltage measurement.

The controller 2 compares the measurement result of the amplitude of the RF signal during performing the substrate processing in chamber 10 with a reference value of the amplitude of the RF signal to determine whether or not the change in the amplitude of the RF signal is within a predetermined range. Then, when the amplitude of the RF signal is within the predetermined range, the controller 2 determines that an error has occurred in the RF signal switching in which the RF signal is pulsed.

Further, the controller 2 compares the measurement result of the pressure in the chamber 10 during performing the substrate processing in the chamber 10 with the target value of the pressure in the chamber 10 to determine whether or not the pressure in the chamber 10 is within a predetermined range. Then, when the pressure in the chamber 10 is not within the predetermined range, the controller 2 determines that an error has occurred in the pressure in the chamber 10.

Further, the controller 2 compares the measurement result of the attraction voltage that is applied to the electrode in the electrostatic chuck 111d during performing the substrate processing in the chamber 10 with a target value of the attraction voltage to determine whether or not the attraction voltage is within a predetermined range. Then, when the attraction voltage is not within the predetermined range, the controller 2 determines that an error has occurred in the attraction of the substrate and/or the edge ring.

Subsequently, when it is determined that an error has occurred in step S101 (step S101: Yes), the controller 2 determines whether or not the substrate processing is suspended (step S102). When the substrate processing is not suspended (step S102: No), the controller 2 stands by until the substrate processing is suspended. Meanwhile, when the substrate processing is suspended (step S102: Yes), the controller 2 instructs the execution of the recovery operation corresponding to the content of the error that has occurred (step S103). Specifically, the controller 2 generates an identifier (error ID) that indicates the content of the error that has occurred, refers to the recovery operation table 2b to identify the recovery operation ID associated with the error ID, and causes the plurality of devices to execute the recovery operation corresponding to the identified recovery operation ID.

For example, when the error ID indicates "RF signal switching failure", the controller 2 identifies the recovery operation ID of "retry" as the corresponding recovery operation from the recovery operation table 2b. Then, after the standby time "30 seconds" elapses after determination is made that an error has occurred, the controller 2 controls the plurality of devices to execute the "retry" corresponding to the identified recovery operation ID. Here, the "retry" is a recovery operation that includes, for example, an operation of pulsing the RF signal again by using the RF power source 31.

When the recovery operation ID of "retry" is identified as the corresponding recovery operation, the controller 2 causes the plurality of devices to execute the "retry" corresponding to the identified recovery operation ID for the corresponding number of retries "1 time". As a result, the number of retries for which a retry is to be executed can be appropriately limited, and unnecessary repetitions of a retry can be avoided.

Further, when the recovery operation ID of "retry" is identified as the corresponding recovery operation, the controller 2 may cause the plurality of devices to re-execute the operation related to an uncompleted step at the time when determination is made that the error has occurred among a plurality of consecutive steps of the substrate processing. At the time when determination is made that an error has occurred, the operation related to an uncompleted step is re-executed; thus, the substrate processing can be appropriately continued depending on the step at which the substrate processing is interrupted.

Further, after having caused the plurality of devices to execute the "retry" corresponding to the identified recovery operation ID, the controller 2 may re-determine whether or not an error has occurred. When it is determined that an error has occurred as a result of re-determining, the controller 2 may cause the plurality of devices to execute the recovery operation with the content set from the "processing stop" and the "maintenance shift". As a result, it is possible to avoid unnecessary repetitions of a retry.

Further, the controller 2 may calculate the "success rate" of the substrate processing after having caused the plurality of devices to execute the "retry" as the recovery operation, and may change the content of the recovery operation from "retry" to "stop processing" when the calculated "success rate" is equal to or less than a threshold value. For example, first, the controller 2 calculates the ratio of substrates for which substrate processing has been completed without causing a target error after performing the "retry" as the recovery operation among the predetermined number of substrates for which substrate processing is to be performed in the chamber 10, as the "success rate." Subsequently, the controller 2 determines whether or not the calculated ratio is equal to or less than a threshold value (for example, 70%), and performs the following processing when the ratio is equal to or less than the threshold value. That is, the controller 2 refers to the recovery operation table 2b to change the recovery operation ID associated with the identifier (error ID) that indicates the content of the target error from "retry" to "processing stop". As a result, it is possible to avoid unnecessary repetitions of a retry.

When the error ID indicates "pressure failure," the controller 2 identifies the recovery operation ID of "processing stop" as the corresponding recovery operation from the recovery operation table 2b. Then, after the standby time "30 seconds" elapses after determination is made that an error has occurred, the controller 2 controls to cause the plurality of devices to execute "processing stop" corresponding to the identified recovery operation ID.

When the recovery operation ID of "processing stop" is identified as the corresponding recovery operation, the controller 2 may control to retrieve the substrate W from the chamber 10 after the substrate processing is stopped. As a result, the substrate W can be appropriately retrieved when an error occurs. Further, after the substrate W is retrieved, the controller 2 may perform automatic inspection processing on the chamber 10. The automatic inspection processing is, for example, at least any one kind of processing of gas flow rate inspection processing of inspecting the flow rate of a processing gas, zero-point inspection processing of inspecting the zero-point of a pressure gauge, and leak inspection processing of inspecting the leak from the chamber 10.

When the error ID indicates "attraction failure", the controller 2 identifies the recovery operation ID of "maintenance shift" as the corresponding recovery operation from the recovery operation table 2b. Then, after the standby time "30 seconds" elapses after determination is made that an error has occurred, the controller 2 controls to cause the plurality of devices to execute "maintenance shift" corresponding to the identified recovery operation ID.

When the processing in step S102 is completed, or when determination is made that an error has not occurred in step S101 (step S101; No), the controller 2 ends a series of processing procedures in the error handling processing.

When it is determined that an error of which a content is not registered in the recovery operation table 2b has occurred in step S101, the controller 2 may notify the operator that a correspondence between the unregistered content of the error and a content of a recovery operation to be executed is to be registered. As a result, the plasma processing apparatus 1 can automatically execute a recovery operation with the content newly registered in the recovery operation table 2b by the operator when an error occurs next time.

When it is determined that an error of which a content is not registered in the recovery operation table 2b has occurred in step S101, the controller 2 may perform the following processing. That is, the controller 2 may register the content of the recovery operation executed by the operator for the error as the content of the recovery work in the recovery operation table in association with the content of the error. As a result, the plasma processing apparatus 1 can automatically execute a recovery operation with the content newly registered in the recovery operation table 2b when an error occurs next time.

When it is determined that an error has occurred in step S101, the controller 2 may determine whether or not the value of the parameter measured by the meter is equal to or less than a threshold value indicating the degree of the error. When it is determined that the value of the parameter is equal to or less than the threshold value, the controller 2 may cause the plurality of devices to execute the "retry" as the recovery operation. Meanwhile, when it is determined that the value of the parameter exceeds the threshold value, the controller 2 may cause the plurality of devices to execute "processing stop" as the recovery operation, and thereafter perform the automatic inspection processing on the chamber 10. As a result, the plasma processing apparatus 1 can automatically perform an appropriate recovery operation according to the degree of the error. The automatic inspection processing is, for example, at least any one kind of processing of gas flow rate inspection processing of inspecting the flow rate of a processing gas, zero-point inspection processing of inspecting the zero-point of a pressure gauge, and leak inspection processing of inspecting the leak from the chamber 10.

As described above, the substrate processing apparatus (for example, plasma processing apparatus 1) according to the embodiment includes a chamber (for example, the chamber 10), a plurality of devices (for example, the gas supply 20, the power source 30, the exhaust system 40, and the electrostatic chuck 111d), and a controller (for example, the controller 2). The chamber is subjected to substrate processing. The plurality of devices execute operations related to substrate processing. The controller controls the operations of the plurality of devices. Further, the controller determines whether an error has occurred during performing the substrate processing in the chamber, and causes the plurality of devices to execute the recovery operation corresponding to the content of the error that has occurred when determination is made that an error has occurred. As a result, the substrate processing apparatus according to the embodiment can suppress the deterioration of the substrate quality when an error occurs during performing the substrate processing in the chamber. Further, the recovery time of the chamber can be shortened by executing the recovery operation. As a result, it is possible to suppress the deterioration of the productivity of the substrate processing apparatus.

Further, when it is determined that an error has occurred, the controller may cause the plurality of devices to execute the recovery operation corresponding to the content of the error that has occurred based on the recovery operation table in which a content of an error is associated with a content of a recovery operation to be executed. As a result, the substrate processing apparatus according to the embodiment can cause the plurality of devices to execute an appropriate recovery operation corresponding to the content of the error that has occurred.

Further, the recovery operation table may include information indicating the standby time from the occurrence of an error to the start of a corresponding recovery operation for each content of error. The controller may cause the plurality of devices to execute the recovery operation after the standby time elapses since determination is made that the error has occurred. As a result, the substrate processing apparatus according to the embodiment can cause the plurality of devices to execute the recovery operation after the appropriate standby time elapses according to the content of the error.

Further, the content of the recovery operation may be set from a retry to re-execute an operation related to the substrate processing, a processing stop to stop the substrate processing, and a maintenance shift to shift to a maintenance mode in which execution of an operation related to the substrate processing is prohibited. As a result, the substrate processing apparatus according to the embodiment can cause the plurality of devices to execute the recovery operation with the content set from the retry, the processing stop, and the maintenance shift regardless of the presence or absence of the operator.

Further, the recovery operation table may include information indicating the number of retries for which a retry is to be executed. When the content of the recovery operation associated with the content of the error that has occurred is a retry, the controller may cause the plurality of devices to re-execute the operation related to the substrate processing by the number of retries. As a result, the substrate processing apparatus according to the embodiment can avoid unnecessary repetitions of a retry.

Further, when the content of the recovery operation associated with the content of the error that has occurred is a retry, the controller may cause the plurality of devices to re-execute the operation related to an uncompleted step at the time when determination is made that an error has occurred among the plurality of steps of the substrate processing. As a result, the substrate processing apparatus according to the embodiment can appropriately continue the substrate processing depending on the step at which the substrate processing is interrupted.

Further, after having caused the plurality of devices to re-execute the operation related to the substrate processing, the controller may re-determine whether or not an error has occurred. When it is determined that an error has occurred, the controller may cause the plurality of devices to execute the recovery operation with the content set from the processing stop and the maintenance shift. As a result, the substrate processing apparatus according to the embodiment can avoid unnecessary repetitions of a retry.

Further, when the content of the recovery operation associated with the content of an error that has occurred is processing stop, the controller may control to retrieve the substrate from the chamber after stopping the substrate processing. As a result, the substrate processing apparatus according to the embodiment can appropriately retrieve the substrate when an error occurs.

Further, the recovery operation table may include information for enabling or disabling the execution of the corresponding recovery operation for each content of error. As a result, the substrate processing apparatus according to the embodiment can selectively disable the execution of the recovery operation when an error occurs.

When it is determined that an error of which a content is not registered in the recovery operation table has occurred, the controller may notify the operator that a correspondence between the unregistered content of the error and a content of a recovery operation to be executed is to be registered. As a result, the substrate processing apparatus according to the embodiment can automatically execute the recovery operation of which a content has been newly registered in the recovery operation table by the operator when an error occurs next time.

Upon determining that an error of which a content is not registered in the recovery operation table has occurred, the controller may register, as the content of the recovery operation, the content of the recovery work executed by the operator for the error in the recovery operation table, in association with the content of the error. As a result, the substrate processing apparatus according to the embodiment can automatically execute a recovery operation of which a content has been newly registered in the recovery operation table when an error occurs next time.

Hitherto, the embodiment has been described above. The embodiment disclosed herein is illustrative and should not be construed as limiting in all aspects. The embodiment described above may be embodied in various forms. The embodiment described above may be omitted, replaced, or modified in various forms without departing from the scope and spirit of the claims.

For example, in the embodiment described above, an example is described, in which the substrate processing apparatus is the plasma processing apparatus 1 that performs plasma processing, but the present disclosure is not limited thereto. The substrate processing apparatus may be any apparatus as long as the apparatus performs substrate processing on the substrate W. For example, the substrate processing apparatus may be a film forming apparatus or the like.

It shall be understood that the embodiments disclosed herein are illustrative and are not restrictive in all aspects. Indeed, the above-described embodiments can be implemented in various forms. The embodiments described above may be omitted, replaced, or modified in various forms without departing from the scope and spirit of the appended claims.

The invention claimed is:

1. A substrate processing apparatus comprising:
a chamber in which substrate processing is performed;
a plurality of devices that execute an operation related to the substrate processing, and
circuitry configured to control the operation of the plurality of devices, wherein
the circuitry determines whether or not an error has occurred during performing of the substrate processing in the chamber, and causes some or all of the plurality of devices to automatically execute a recovery operation corresponding to a content of the error that has occurred when the circuitry determines that the error has occurred and has suspended the substrate processing, wherein
when it is determined that the error has occurred, the circuitry causes the some or the all of the plurality of devices to execute the recovery operation with a content associated with the content of the error that has occurred based on a recovery operation table in which the content of the error is associated with a content of a recovery operation to be executed, and
the content of the recovery operation is one of a retry to re-execute an operation related to the substrate processing, a processing stop stopping the suspended substrate processing and retrieve a substrate from the chamber, and a maintenance shift shifting to a maintenance mode in which execution of the operation related to the substrate processing is prohibited.

2. The substrate processing apparatus according to claim 1, wherein
the recovery operation table includes information indicating standby time from occurrence of the error to start of the corresponding recovery operation for each content of the error, and
the circuitry causes the some or the all of the plurality of devices to execute the recovery operation after the standby time elapses since determination is made that the error has occurred.

3. The substrate processing apparatus according to claim 1, wherein
the recovery operation table includes information indicating a number of retries for which the retry is to be executed, and
when the content of the recovery operation associated with the content of the error that has occurred is the retry, the circuitry causes the some or the all of the plurality of devices to re-execute the operation related to the substrate processing by the number of retries.

4. The substrate processing apparatus according to claim 1, wherein
when the content of the recovery operation associated with the content of the error that has occurred is the retry, the circuitry causes the some or the all of the plurality of devices to re-execute an operation related to an uncompleted step at a time when determination is made that the error has occurred among a plurality of steps of the substrate processing.

5. The substrate processing apparatus according to claim 3, wherein
after the circuitry causes the some or the all of the plurality of devices to re-execute the operation related to the substrate processing, the circuitry re-determines whether or not an error has occurred, and causes the some or the all of the plurality of devices to execute the recovery operation with the content of either the processing stop or the maintenance shift when determination is made that the error has occurred.

6. The substrate processing apparatus according to claim 1, wherein when the content of the recovery operation associated with the content of the error that has occurred is the processing stop, the circuitry performs control to retrieve a substrate from the chamber after stopping the substrate processing.

7. The substrate processing apparatus according to claim 1, wherein the recovery operation table includes information for enabling or disabling execution of the recovery operation corresponding to each content of the error.

8. The substrate processing apparatus according to claim 1, wherein when it is determined that the error of which a content is not registered in the recovery operation table has occurred, the circuitry performs control to notify an operator that a correspondence between the unregistered content of the error and a content of a recovery operation to be executed is to be registered.

9. The substrate processing apparatus according to claim 1, wherein when it is determined that the error of which a content is not registered in the recovery operation table has occurred, the circuitry performs control to register, as the content of the recovery operation, a content of recovery work executed by the operator for the error in the recovery operation table, in association with the content of the error.

10. The substrate processing apparatus according to claim 1, wherein the circuitry is configured to use a meter that measures a parameter indicating a state of the substrate processing to determine whether or not the error has occurred, when it is determined that the error has occurred, determine whether or not a value of the parameter is equal to or less than a threshold value indicating a degree of the error, when it is determined that the value of the parameter is equal to or less than the threshold value, cause the some or the all of the plurality of devices to execute the retry as the recovery operation, and when it is determined that the value of the parameter exceeds the threshold value, cause the some or the all of the plurality of devices to execute the processing stop as the recovery operation, and thereafter performs automatic inspection processing on the chamber.

11. The substrate processing apparatus according to claim 1, wherein the recovery operation table includes information indicating standby time from occurrence of the error to start of the corresponding recovery operation for each content of the error.

12. The substrate processing apparatus according to claim 1, wherein the recovery operation table includes information indicating a number of retries for which the retry is to be executed.

13. The substrate processing apparatus according to claim 1, wherein the circuitry is configured to use a meter that measures a parameter indicating a state of the substrate processing to determine whether or not the error has occurred, when it is determined that the error has occurred, determine whether or not a value of the parameter is equal to or less than a threshold value indicating a degree of the error, and when it is determined that the value of the parameter is equal to or less than the threshold value, cause the plurality of devices to execute the retry as the recovery operation.

* * * * *